US012812989B2

(12) United States Patent
Fang et al.

(10) Patent No.: US 12,812,989 B2
(45) Date of Patent: Nov. 24, 2026

(54) METHOD FOR MAKING IMAGE SENSOR

(71) Applicant: Shanghai Huali Microelectronics Corporation, Shanghai (CN)

(72) Inventors: Xing Fang, Shanghai (CN); Chenchen Qiu, Shanghai (CN); Jun Qian, Shanghai (CN); Chang Sun, Shanghai (CN); Zhengying Wei, Shanghai (CN)

(73) Assignee: Shanghai Huali Microelectronics Corporation, Shanghai (CN)

( * ) Notice: Subject to any disclaimer, the term of this patent is extended or adjusted under 35 U.S.C. 154(b) by 346 days.

(21) Appl. No.: 18/663,534

(22) Filed: May 14, 2024

(65) Prior Publication Data

US 2025/0107251 A1 Mar. 27, 2025

(30) Foreign Application Priority Data

Sep. 22, 2023 (CN) ........................ 202311234811.3

(51) Int. Cl.
*H10F 39/00* (2025.01)

(52) U.S. Cl.
CPC .................................. *H10F 39/014* (2025.01)

(58) Field of Classification Search
CPC ...... H10F 39/014; H10F 39/011; H10F 39/18; H10F 39/80373; H10F 39/807
See application file for complete search history.

(56) References Cited

U.S. PATENT DOCUMENTS

2011/0204425 A1* 8/2011 Lee ...................... H10D 64/516
257/292

FOREIGN PATENT DOCUMENTS

CN 111952328 A * 11/2020 ............ H10F 39/011
CN 114005846 A * 2/2022 ............ H10F 39/18

* cited by examiner

*Primary Examiner* — Jay C Kim
*Assistant Examiner* — Woo K Lee
(74) *Attorney, Agent, or Firm* — Banner & Witcoff, Ltd.

(57) ABSTRACT

The present application discloses a method for making an image sensor, wherein an additional supplementary oxide layer is added in a PD area of a pixel cell before the formation of a gate oxide layer, a layer of a first photoresist is added and photoetching is used to define a PD area of a non-pixel cell, a supplementary oxide layer outside the PD area is removed by etching, retaining the supplementary oxide layer in the PD area. Thus, a relatively thick oxide layer can be formed in the PD area before polysilicon generation, blanket etching can be performed on the surface of the PD area during subsequent DG-ET (double-gate etching) and poly etch, and surface damage can be avoided during etching, reducing the plasma interference, and ultimately, the pixel dark current to improve pixel performance.

8 Claims, 5 Drawing Sheets

METHOD FOR MAKING IMAGE SENSOR

CROSS-REFERENCE TO RELATED APPLICATIONS

This application claims priority to Chinese patent application No. 202311234811.3, filed on Sep. 22, 2023, the disclosure of which is incorporated herein by reference in its entirety.

TECHNICAL FIELD

The present application relates to semiconductor making technology and, in particular, to a method for making an image sensor.

BACKGROUND

For small-pixel image sensors produced by a conventional Fab (fabrication, a chip maker) as shown in FIG. 1, the logical areas and pixel areas are etched at the same time during poly etch. However, a depth for subsequent N-type injection is relatively shallow to improve lag performance for large-pixel PD (photo-diode, photoelectric conversion) areas, and FWC (Full Well Capacity) mainly relies on shallow-layer N-type injection for the PD areas, requiring minimum etching damage to the surface of the PD areas.

A method in the prior art for forming a CMOS image sensor includes: providing a device wafer, dividing it into a logical area, and a pixel area, spacing the logical area from the pixel area by a shallow trench isolation structure, wherein the pixel area includes a photoelectric conversion area and a pixel transistor area, and the photoelectric conversion area is adjacent to the pixel transistor area. Then, a gate is formed on the logical area and the pixel area, respectively, and the gate of the pixel area is located on the pixel transistor area. Next, a first side wall is formed at both sides of the gates of the logical area and the pixel area, the first side wall of the pixel area is located in the pixel transistor area, a dielectric layer exactly covering the first side wall is formed on the first side wall, and a second side wall exactly covering the dielectric layer is formed on the dielectric layer. However, the second side wall is formed by the following process: first forming a silicon nitride layer covering upper surfaces of a dielectric layer and a first gate, and a surface of a device wafer between the first gate and second gate, and then a portion of the silicon nitride layer is etched to form a second side wall which exactly covers the dielectric layer, and does not cover a surface of a device wafer of a photoelectric conversion area.

Damage is caused to a surface of a device wafer in a PD area because a device wafer is wholly etched during etching of a silicon nitride layer when making a CMOS image sensor in an existing method for forming the sensor. Large-pixel CMOS (a pixel size>5 um) image sensors may be subjected to more serious surface etching damage because an etching area is relatively large during poly etch due to a relatively shallow N-type injection for PD areas. Additionally, the large-pixel sensors may have poor pixel area performance because a relatively serious plasma interference is caused for the device wafer surface of the PD area during poly etch and further a dark current is produced in which the dark current is produced within the sensors by non-light factors without lighting. Further, the dark current may have lethal effects on the imaging quality of the security products derived from the large-pixel sensors due to a relatively small photocurrent under a low illumination environment.

Additionally, an oxide layer formed in the PD area is very shallow before polysilicon generation in the prior art CMOS process, and a DG (Dual gate, dual gate) process can only enable a surface oxide layer of about 70 Å. Thus, blocking is insufficient during poly etch.

BRIEF SUMMARY

The present disclosure provides a method for making an image sensor, wherein blanket etch can be performed for the surface of the PD areas during subsequent DG-ET (double-gate etch) and poly etch, and damage to the surface caused by etching can be avoided, reducing the plasma interference, and ultimately, the pixel dark current to improve pixel performance.

The method for making an image sensor, including the following steps:

S1. forming shallow trench isolation 101 on a substrate 100, the shallow trench isolation isolating the substrate into a pixel area 102, and a logical area 103;

S2. performing a well process to form a well 111 for a photoelectric conversion area and a well 112 for a pixel transistor area in the pixel area, and a well 113 for a logical transistor area in the logical area 103;

S3. growing a supplemental oxide layer 114 on a wafer surface;

S4. covering the wafer surface with a first photoresist 115;

S5. performing photoetching to remove the first photoresist 115 on the wafer surface outside the photoelectric conversion area, retaining the first photoresist 115 on the wafer surface in the photoelectric conversion area;

S6. etching to remove the supplemental oxide layer 114 on the wafer surface outside the photoelectric conversion area, and then removing the first photoresist 115;

S7. forming a first gate oxide layer 116 on the wafer surface;

S8. covering the wafer surface with a second photoresist 117

S9. performing photoetching to remove the second photoresist 117 on the wafer surface of the logical area 103, retaining the second photoresist 117 on the wafer surface of the pixel area 102;

S10. etching to remove the first gate oxide layer 116 on the wafer surface of the logical area 103, retaining the first gate oxide layer 116 on the wafer surface of the pixel area 102, and then removing the second photoresist 117;

S11. forming a second gate oxide layer 118 on the wafer surface;

S12. depositing polysilicon 119 on the upper surface of the second gate oxide layer 118; and S13. performing subsequent processes.

In some examples, in step S3, the supplementary oxide layer 114 is a high-temperature oxide film grown on the wafer surface by using a furnace tube process.

In some examples, the high temperature oxide film is obtained by reacting $SiH_4$ with $H_2O$ at 750 °C-850 °C.

In some examples, the supplemental oxide layer 114 has a thickness of 140 Å-160 Å.

In some examples, the first gate oxide layer 116 has a thickness of 40 Å-60 Å.

In some examples, the subsequent processes comprise:

S131. forming a polysilicon hard mask layer 120;

S132. performing photolithographic etching to remove the polysilicon 119 and polysilicon hard mask layer 120 of the wafer surfaces of the middle portion of the well 113 of the logical transistor area, the photoelectric conversion area, and the shallow trench isolation, retaining the polysilicon 119 and polysilicon hard mask layer 120 of the wafer surfaces of the left and right portions of the well 113 of the logical transistor area, and the well 112 of the pixel transistor area.

In some examples, the polysilicon hard mask layer 120 is SIN-SIO2-SIN from bottom to top.

In some examples, the image sensor has a pixel unit size greater than 5 um.

In the method for making an image sensor of the present application, the additional supplementary oxide layer 114 is added in a PD area of a pixel cell before the formation of a gate oxide layer, a layer of a first photoresist (a COX1 photoresist) is added, photoetching is used to define a PD area of a non-pixel cell, and the supplementary oxide layer 114 on the wafer surface outside the PD area is removed by etching, retaining the supplementary oxide layer 114 in the PD area. Thus, a relatively thick oxide layer can be formed in the PD area before polysilicon generation, blanket etching can be performed on the surface of the PD area during subsequent DG-ET (double-gate etching) and poly etch, and surface damage can be avoided during etching, reducing the plasma interference, and ultimately, the pixel dark current to improve pixel performance. The image sensor making method, as the optimization to the existing mature process, can be performed by using existing equipment, and is easy to implement and can significantly improve the dark current with few side effects.

BRIEF DESCRIPTION OF THE DRAWINGS

The figures required for the present application are briefly introduced hereafter to illustrate the technical solution of the application more clearly. It is obvious that the figures described below are only some embodiments of the application, and that other figures can be obtained by those skilled in the art based on these figures without creative labor.

DETAILED DESCRIPTION OF THE DISCLOSURE

The technical solutions in the embodiments of the present application may be described clearly below in conjunction with the figures in the embodiments. It is obvious that the described embodiments are only some of the embodiments of the application. The scope of protection of the present application encompasses all other embodiments obtained by those skilled in the art without creative labor based on the embodiments of the application.

Terms such as "first", "second", etc. in the present application do not indicate any order, number, or importance, but are only to distinguish different parts. The phasing "including", "comprising", etc. means that the element or object preceded by the phasing covers the element or object and equivalents thereof listed below the phasing, but does not exclude other elements or objects. The expression such as "connected", "coupled", etc. is not limited to physical or mechanical connections, but may include direct or indirect electrical connections. "Upper", "lower", "left", "right", etc. are used only to indicate relative positional relations. When an absolute position of a described object is changed, the relative positional relations may also be changed accordingly.

It should be noted that the embodiments of the present application and the features thereof may be combined with each other without contradictory.

Embodiment I

Figure 1:
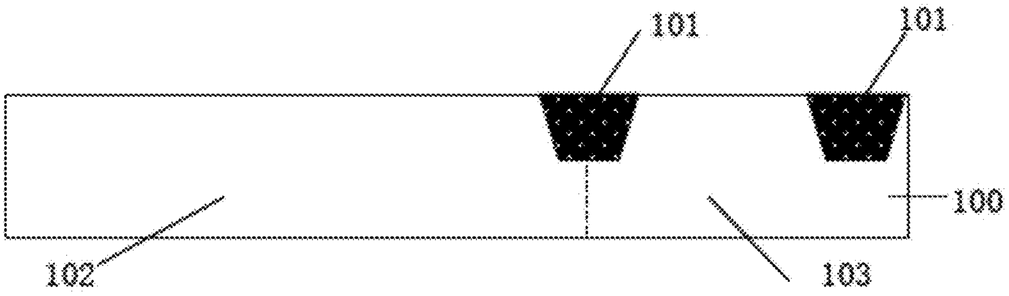
FIG. 1 is a schematic diagram of STI formation according to an embodiment of the method for making an image sensor of the present application.
Figure 2:
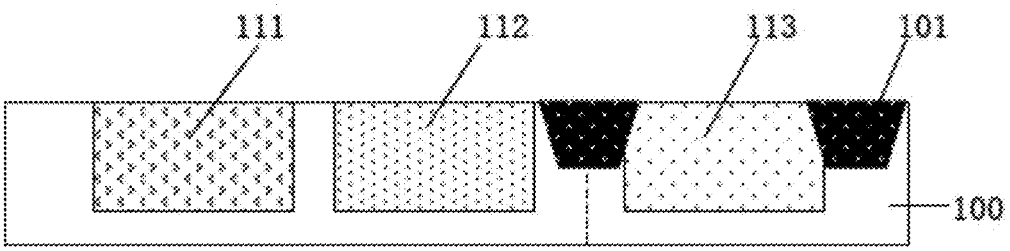
FIG. 2 is a schematic diagram of the completion of a well process according to an embodiment of the method for making an image sensor of the present application.
Figure 3:
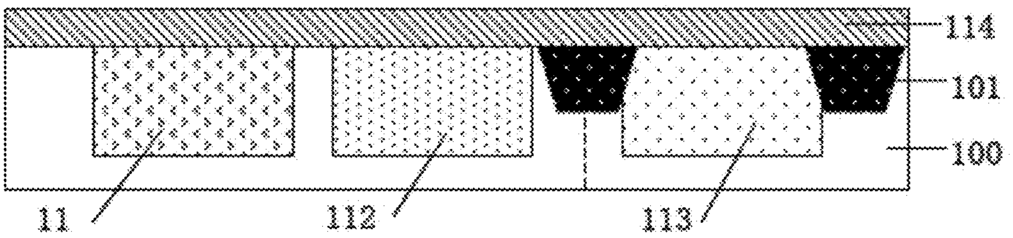
FIG. 3 is a schematic diagram of the growth of a supplemental oxide layer according to an embodiment of the method for making an image sensor of the present application.
Figure 4:
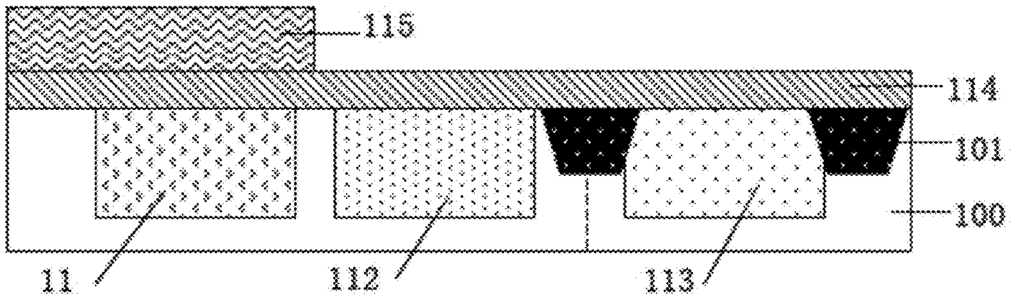
FIG. 4 is a schematic diagram of photoetching of a first photoresist according to an embodiment of the method for making an image sensor of the present application.
Figure 5:
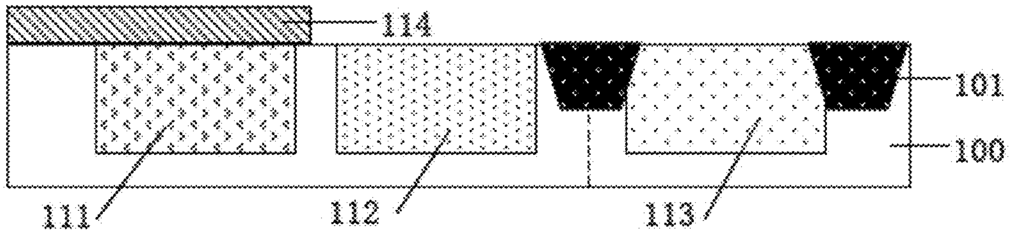
FIG. 5 is a schematic diagram of etching to remove a supplemental oxide layer on a wafer surface outside a PD area according to an embodiment of the method for making an image sensor of the present application.
Figure 6:
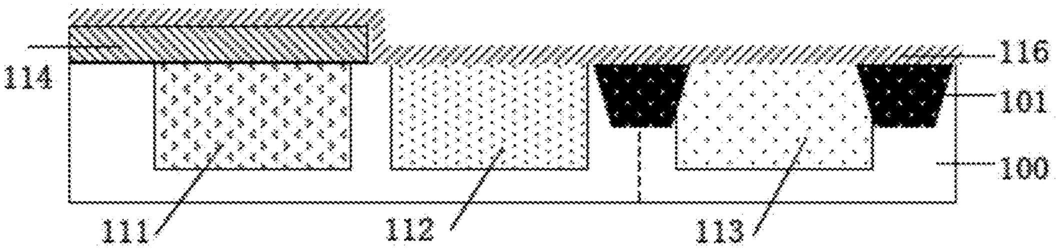
FIG. 6 is a schematic diagram of forming a first gate oxide layer on a wafer surface according to an embodiment of the method for making an image sensor of the present application.
Figure 7:
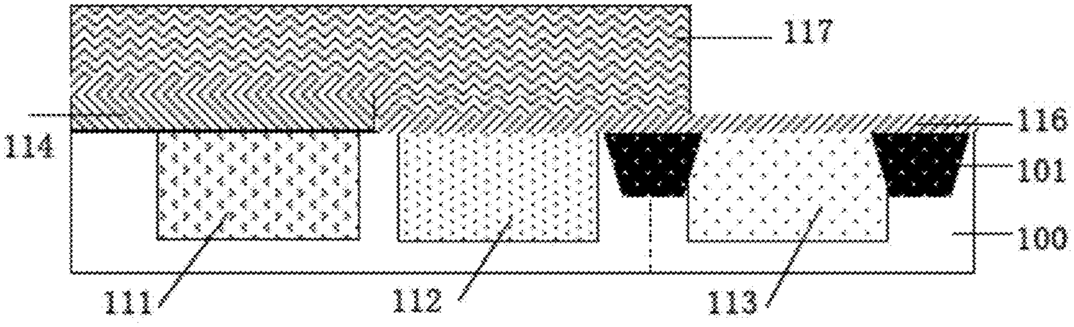
FIG. 7 is a schematic diagram of photoetching to remove a second photoresist on a wafer surface in a logical area according to an embodiment of the method for making an image sensor of the present application.

As shown in FIGS. 1 to 13, a method for making an image sensor comprises the following steps:

S1. forming STI (shallow trench isolation) 101 on a substrate 100, the STI isolating the substrate into a pixel area 102 and a logical area 103, as shown in FIG. 1;

S2. performing a well process to form a well 111 for a photoelectric conversion area and a well 112 for a pixel transistor area in the pixel area, and a well 113 for a logical transistor area in the logical area 103, as shown in FIG. 2;

S3. growing a supplemental oxide layer 114 on a wafer surface, as shown in FIG. 3;

S4. covering the wafer surface with a first photoresist (a COX1 photoresist) 115;

S5. photoetching to remove the first photoresist (a COX1 photoresist) 115 of the wafer surface outside the PD area, retaining the first photoresist (a COX1 photoresist) 115 on the wafer surface of the PD area, as shown in FIG. 4;

S6. etching to remove the supplemental oxide layer 114 on the wafer surface outside the PD area, and then removing the first photoresist (a COX1 photoresist) 115, as shown in FIG. 5;

S7. forming a first gate oxide layer 116 on the wafer surface, as shown in FIG. 6;

S8. covering the wafer surface with a second photoresist (a DG photoresist) 117;

S9. performing photoetching to remove the second photoresist (a DG photoresist) 117 on the wafer surface of the logical area 103, retaining the second photoresist (a DG photoresist) 117 on the wafer surface of the pixel area 102, as shown in FIG. 7

Figure 8:
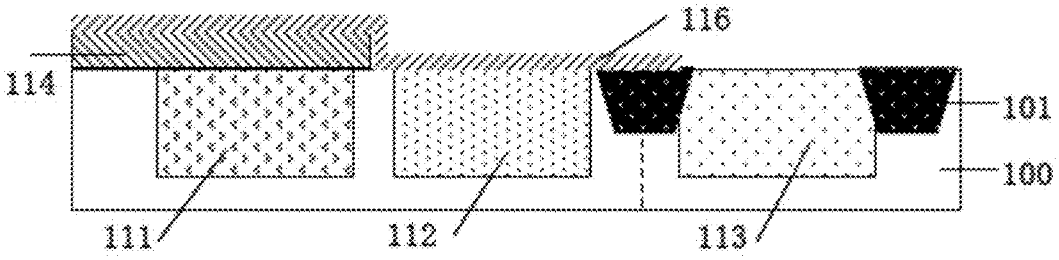
FIG. 8 is a schematic diagram of etching to remove a first gate oxide layer on a wafer surface in a logical area according to an embodiment of the method for making an image sensor of the present application.
Figure 9:
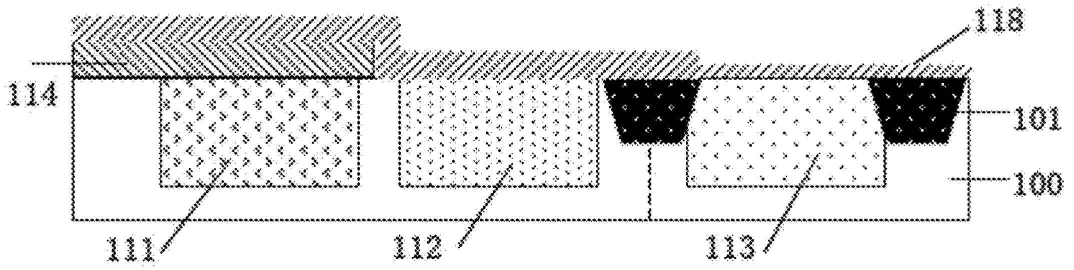
FIG. 9 is a schematic diagram of forming a second gate oxide layer on a wafer surface according to an embodiment of the method for making an image sensor of the present application.
Figure 10:
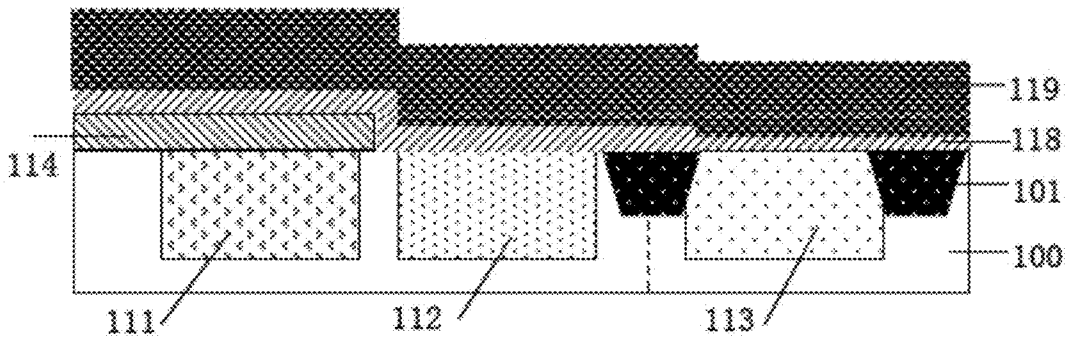
FIG. 10 is a schematic diagram of precipitating polysilicon according to an embodiment of the method for making an image sensor of the present application.

S10. etching to remove the first gate oxide layer 116 on the wafer surface of the logical area 103, retaining the first gate oxide layer 116 on the wafer surface of the pixel area 102, and then removing the second photoresist (a DG photoresist) 117, as shown in FIG. 8;

S11. forming a second gate oxide layer 118 on the wafer surface, as shown in FIG. 9;

S12. depositing polysilicon 119 on the upper surface of the second gate oxide layer 118, as shown in FIGS. 10; and S13. performing subsequent processes.

In the method for making an image sensor in embodiment I, the additional supplementary oxide layer 114 is added in a PD area of a pixel cell before the formation of a gate oxide layer, a layer of a first photoresist (a COX1 photoresist) is added, photoetching is used to define a PD area of a non-pixel cell, and the supplementary oxide layer 114 on the wafer surface outside the PD area is removed by etching, retaining the supplementary oxide layer 114 in the PD area. Thus, a relatively thick oxide layer can be formed in the PD area before polysilicon generation, blanket etching can be performed on the surface of the PD area during subsequent DG-ET (double-gate etching) and poly etch, and surface damage can be avoided during etching, reducing the plasma interference, and ultimately, the pixel dark current (it is expected that the dark current can be reduced by 25%) to improving pixel performance. The image sensor making method, as the optimization to the existing mature process, can be performed by using existing equipment, and is easy to implement and can significantly improve the dark current with few side effects.

Embodiment II

This embodiment is based on the image sensor making method of example I, and in step S3, the supplemental oxide layer 114 is a high-temperature oxide (HTO) film grown on the wafer surface by using a furnace tube process.

In some examples, the high temperature oxide (HTO) film is silicon dioxide ($SiO_2$) or silicon tetrachloride ($SiO_4$) obtained by reacting silane ($SiH_4$) with $H_2O$ at 750 °C-850 °C (e.g., 850 °C).

In some examples, the supplemental oxide layer 114 has a thickness of 140 Å-160 Å (e.g., 150 Å).

In some examples, the first gate oxide layer 116 has a thickness of 40 Å-60 Å (e.g., 50 Å)

In the image sensor making method of embodiment II, the high temperature oxide (HTO) film in the PD area is retained, and subsequently, a gate oxide layer of about 50 Å is further grown at the interface between the high temperature oxide (HTO) film and silicon, so as to increase the overall thickness of the oxide layer on the PD area to about 200 Å, and thus, effective blocking for the PD area is generated during subsequent poly etch.

Embodiment III

Figure 11:
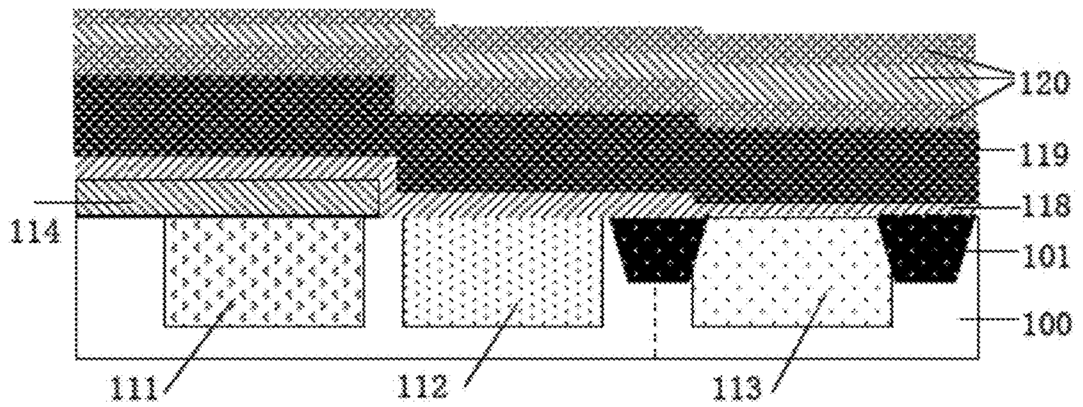
FIG. 11 is a schematic diagram of forming a polysilicon hard mask layer according to an embodiment of the method for making an image sensor of the present application.
Figure 12:
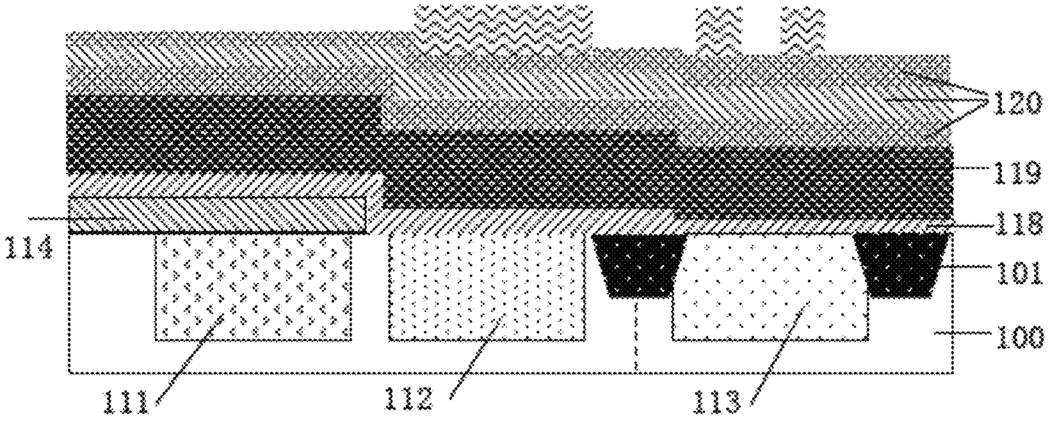
FIG. 12 is a schematic diagram of DG (Dual gate, double gate) photoetching according to an embodiment of the method for making an image sensor of the present application.
Figure 13:
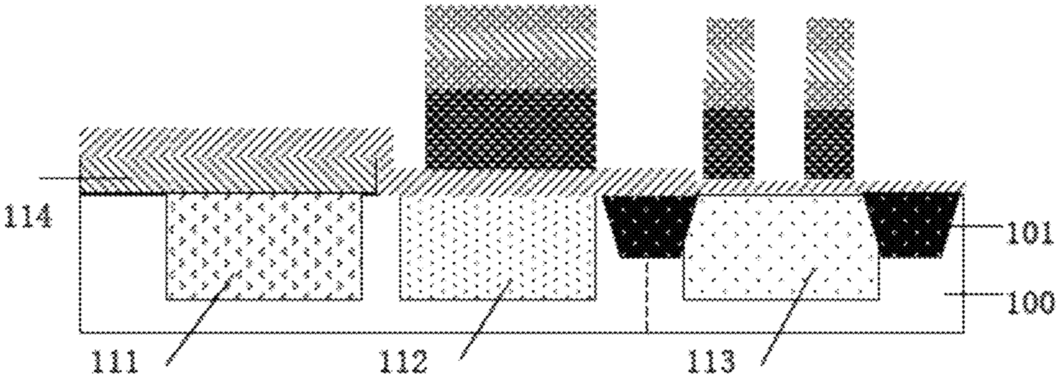
FIG. 13 is a schematic diagram of DG etching according to an embodiment of the method for making an image sensor of the present application.

This embodiment is based on the method for making an image sensor of example I, and includes subsequent processes comprising:

S131. forming a polysilicon hard mask layer 120, as shown in FIG. 11;

S132. performing photolithographic etching, as shown in FIGS. 12 and 13, to remove the polysilicon 119 and polysilicon hard mask layer 120 of the wafer surfaces of the middle portion of the well 113 of the logical transistor area, the photoelectric conversion area, and the shallow trench isolation, retaining the polysilicon 119 and polysilicon hard mask layer 120 of the wafer surfaces of the left and right portions of the well 113 of the logical transistor area, and the well 112 of the pixel transistor area.

In some examples, the polysilicon hard mask layer 120 is SIN-SIO2-SIN from bottom to top.

In some examples, the image sensor is a CMOS image sensor with a pixel cell size (a pixel size) greater than 5 um.

The embodiments described above are only preferred embodiments of the present application and are not intended to limit the present application. The scope of protection of the application shall include any modifications, equivalent substitutions, improvements, etc. made within the spirit and principles of the present application.

What is claimed is:

1. A method for making an image sensor, comprising the steps of:

S1: forming shallow trench isolation (101) in a substrate (100), the shallow trench isolation isolating the substrate into a pixel area (102) and a logical area (103);

S2: performing a well process to form a well (111) for a photoelectric conversion area and a second well (112) for a pixel transistor area in the pixel area, and a third well (113) for a logical transistor area in the logical area (103);

S3: growing an oxide layer (114) on a wafer surface;

S4: covering the wafer surface with a first photoresist (115);

S5: performing photoetching to remove the first photoresist (115) on the wafer surface outside the photoelectric conversion area, retaining the first photoresist (115) on the wafer surface in the photoelectric conversion area;

S6: etching to remove the oxide layer (114) on the wafer surface outside the photoelectric conversion area, and then removing the first photoresist (115);

S7: forming a first gate oxide layer (116) on the wafer surface;

S8: covering the wafer surface with a second photoresist (117);

S9: performing photoetching to remove the second photoresist (117) on the wafer surface of the logical area (103), retaining the second photoresist (117) on the wafer surface of the pixel area (102);

S10: etching to remove the first gate oxide layer (116) on the wafer surface of the logical area (103), retaining the first gate oxide layer (116) on the wafer surface of the pixel area (102), and then removing the second photoresist (117);

S11: forming a second gate oxide layer (118) on the wafer surface;

S12: depositing a polysilicon (119) on an upper surface of the second gate oxide layer (118); and S13: performing subsequent processes.

2. The method for making the image sensor according to claim 1, wherein, in step S3, the oxide layer (114) is a high-temperature oxide film grown on the wafer surface by using a furnace tube process.

3. The method for making the image sensor according to claim 2, wherein the high-temperature oxide film is obtained by reacting SiH4 with H2O at 750 °C-850 °C.

4. The method for making the image sensor according to claim 1, wherein the oxide layer (114) has a thickness of 140 Å to 160 Å.

5. The method for making the image sensor according to claim 4, wherein the first gate oxide layer (116) has a thickness of 40 Å-60 Å.

6. The method for making the image sensor according to claim 1, wherein the subsequent processes comprise:

S131: forming a polysilicon hard mask layer (120); and

S132: performing photolithographic etching to remove the polysilicon (119) and polysilicon hard mask layer (120) of the wafer surfaces of a middle portion of the third well (113) of the logical transistor area, the photoelectric conversion area, and the shallow trench isolation, retaining the polysilicon (119) and the polysilicon hard mask layer (120) of the wafer surfaces of left and right portions of the third well (113) of the logical transistor area, and the second well (112) of the pixel transistor area.

7. The method for making the image sensor according to claim 6, wherein the polysilicon hard mask layer (120) is SIN-SIO2-SIN from bottom to top.

8. The method for making the image sensor according to claim 6, wherein the image sensor has a pixel unit size greater than 5 um.

* * * * *